(12) United States Patent
Choy et al.

(10) Patent No.: US 7,134,895 B1
(45) Date of Patent: Nov. 14, 2006

(54) PC BOARD ASSEMBLY

(75) Inventors: Edmond Choy, Unin City, CA (US); Xiao Feng, Kunshan (CN); Xiao-Gao Yang, Kunshan (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/218,698

(22) Filed: Sep. 3, 2005

(51) Int. Cl.
*H01R 13/62* (2006.01)

(52) U.S. Cl. .................................... 439/326
(58) Field of Classification Search ........... 439/83, 439/328, 329, 326, 570, 566, 630
See application file for complete search history.

(56) References Cited

U.S. PATENT DOCUMENTS

| | | | | |
|---|---|---|---|---|
| 3,701,071 A * | 10/1972 | Landman | ................ | 200/5 R |
| 3,848,952 A * | 11/1974 | Tighe, Jr. | ................ | 439/326 |
| 4,678,252 A * | 7/1987 | Moore | ................ | 439/62 |
| 5,951,315 A * | 9/1999 | Ichimura | ................ | 439/326 |
| 6,234,820 B1 * | 5/2001 | Perino et al. | ................ | 439/326 |
| 6,431,897 B1 * | 8/2002 | Hashiguchi et al. | ................ | 439/267 |
| 6,848,927 B1 * | 2/2005 | Shirai | ................ | 439/326 |
| 6,926,549 B1 * | 8/2005 | Wang | ................ | 439/326 |
| 6,955,554 B1 * | 10/2005 | Korsunsky et al. | ................ | 439/328 |
| 2004/0152353 A1 * | 8/2004 | Kawamae | ................ | 439/328 |
| 2005/0048828 A1 * | 3/2005 | Ho et al. | ................ | 439/326 |

* cited by examiner

*Primary Examiner*—Chandrika Prasad
*Assistant Examiner*—Harshad C Patel
(74) *Attorney, Agent, or Firm*—Wei Te Chung

(57) ABSTRACT

A latching mechanism for holding an electronic card on a printed circuit board, includes an insulative fixing device mounted to the printed circuit board and a metallic latching device attached to the fixing device. The fixing device provides the positioning post extending through the positioning hole of the electronic card and the latching device provides a hook section downwardly pressing the electronic card so as to have the electronic card in a parallel relation with the printed circuit board. A card edge connector is provided on the printed circuit board for cooperatively holding the electronic card thereon.

2 Claims, 5 Drawing Sheets

PC BOARD ASSEMBLY

BACKGAROUND

1. Field of the Invention

The invention relates to an electrical assembly, and particularly to a PC (Printed Circuit) board assembly having an electronic card electrically and mechanically connector to a mother board via an electrical connector and a latching mechanism in a parallel manner.

2. The Related Art

Taiwan patent number M261882 discloses a kind of latching mechanism for use with a card edge connector, wherein the latching mechanism including a spring piece including a fixed section and two spring arms, said fixed section being fixed to the printed circuit board and two spring arms extending from the two opposite ends of the fixed section, each of the spring arms including at a distal end a supporting portion and a latching portion, both of which defines positioning openings toward the card edge connector. The supporting portion defines the upward position post toward the card edge connector. The positioning openings confine the rear portion of the card edge connector, and the positioning posts extend through the corresponding positioning hole of the card edge connector. Because the latching mechanism is integrally made from plastic, the latching portion, the support portion and the position post, which extends from the support portion, all are located at the distal end of the spring arm. Thus, during latching or unlatching process with regard to the electronic card, the aforementioned latching portion, the support portion and the positioning post all associatively moved along with the distal end of the spring arm synchronically. Because the positioning hole is so small that the positioning post is essentially compactly received therein, thus resulting in limited moving distance of the distal end of the spring arm. As a result, the latching portion has less moveability and less effective latching area with regard to the rear portion of the electronic card. It is possible for the electronic card to be withdrawn from the latching mechanism in vibration.

China patent publication number 1523714A discloses latching mechanism for use with the card edge connector, wherein the latching mechanism defines a latching portion at a distal end of the spring arm while the support portion and the positioning post, which extends from the support portion, are fixed to the printed circuit board. This design allows the better guiding function of the positioning post and the electronic card does not tend to be withdrawn from the latching portion. Anyhow, the latching mechanism is made from a single metal piece in forming which results in complicated structure and the uncontrollable dimension and position precision. Understandably, this design has difficulties in manufacturing. On the other hand, the metallic latching mechanism disadvantageously tends to result in shorting if the neighboring component is densely arranged therearound Therefore, it is desired to have an improved latching mechanism for use with the card edge connector.

SUMMARY OF THE INVENTION

According to an aspect, the invention is to provide a latching mechanism for use with a card edge connector which electrically and mechanically connects an electronic card to a printed circuit board. The latching mechanism includes an insulative fixing device and a separate spring latching device, wherein the fixing device includes the card supporting portion and a positioning post extending therefrom corresponding to the positioning hole of the electronic card. The latching device includes a connection portion connected to the fixing device, the spring arm extending from the connection portion and the hook portion located on the spring arm and extending toward the card edge connector for locking the rear portion of the electronic card.

Advantageously, because isolation of the support portion and the positioning post from the hook portion, it is no longer possible for the supporting portion and the positioning post to be moved along with the hook portion synchronically. As a result, the locking area of the hook portion with regard to the electronic card may increase. On the other hand, separation of the fixing device and the latching device may ease manufacturing and designing. Moreover, the insulation of the fixing device may reduce the risk of shorting with regard to the neighboring component, and especially in a dense arrangement of the component on the printed circuit board.

Another feature of the invention includes a fastening device for combing the fixing device and the latching device together. The fastening device may include the rivet structure or the slot/plate structure. Accordingly, when the latching mechanism is applied to different situations at different heights, it is only required to change the fixing device while keeping the similar latching device, thus saving money.

BEIEF DESCRIPTION OF THE DRAWINGS

DETAILED DESCRIPTION OF THE PREFERRED EMBODIMENT

References will now be in detail to the preferred embodiments of the invention. While the present invention has been described in with reference to the specific embodiments, the description is illustrative of the invention and is not to be construed as limiting the invention. Various modifications to the present invention can be made to the preferred embodiments by those skilled in the art without departing from the true spirit and scope of the invention as defined by appended claims.

Figure 1:
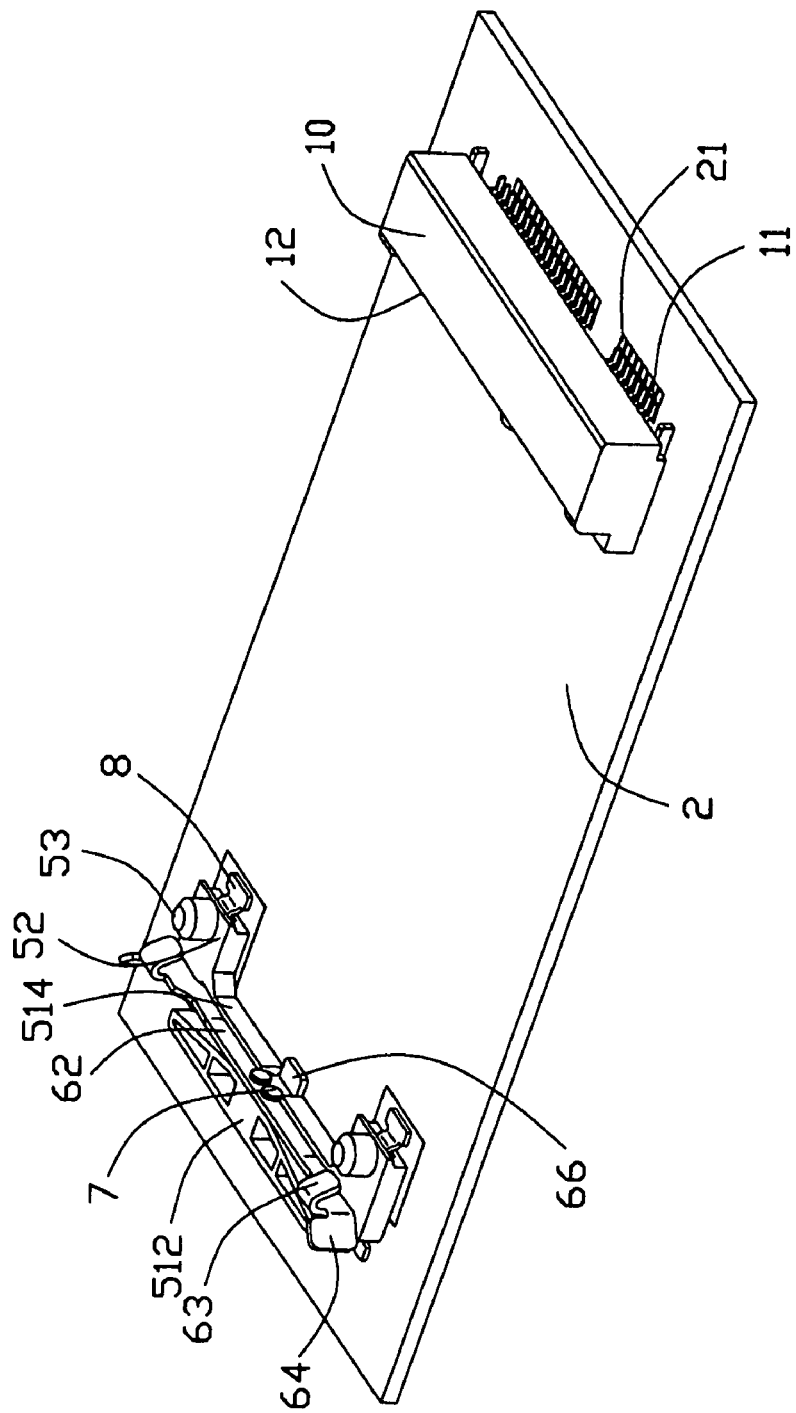
FIG. 1 is a perspective view of the latching mechanism and the corresponding card edge connector both mounted upon a printed circuit board.
Figure 2:
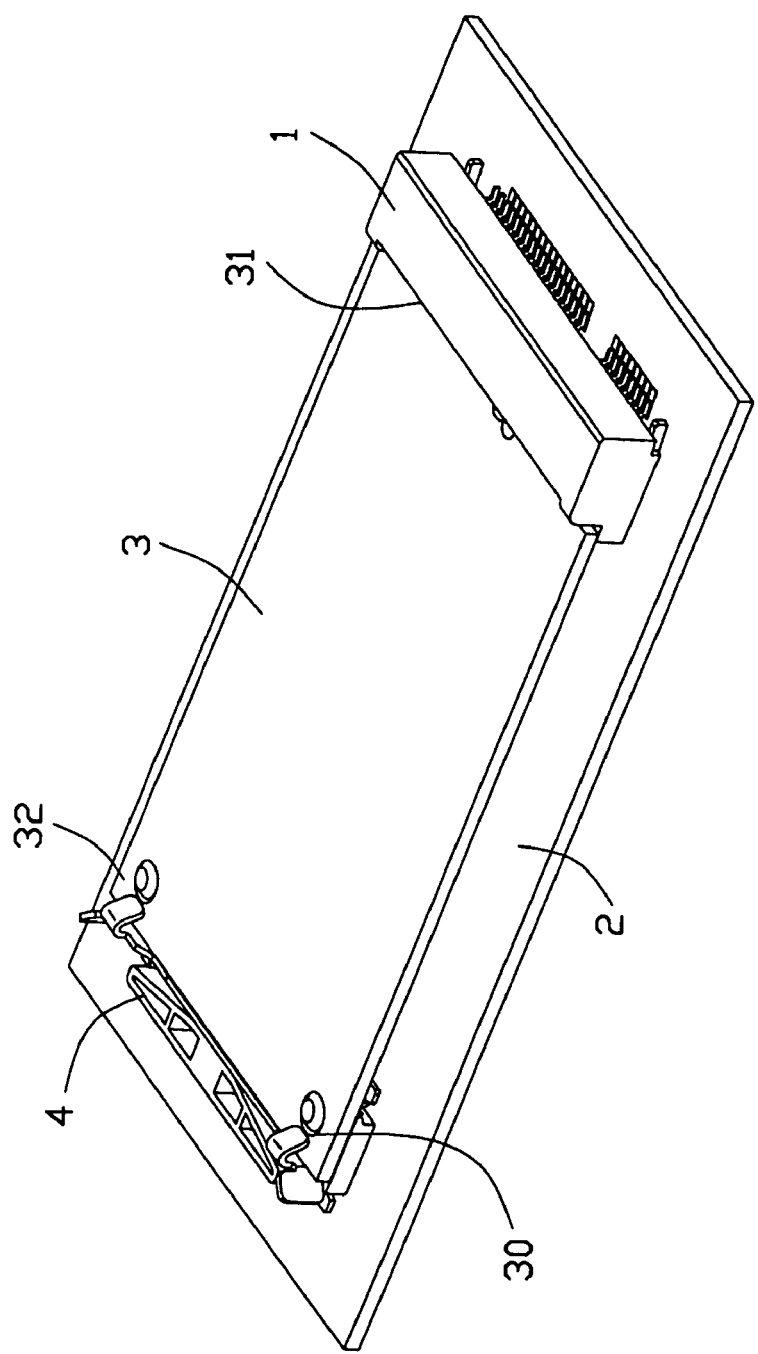
FIG. 2 is a perspective view of the latching mechanism and the corresponding card edge connector on the printed circuit board of FIG. 1, and the corresponding electronic card thereof.
Figure 3:
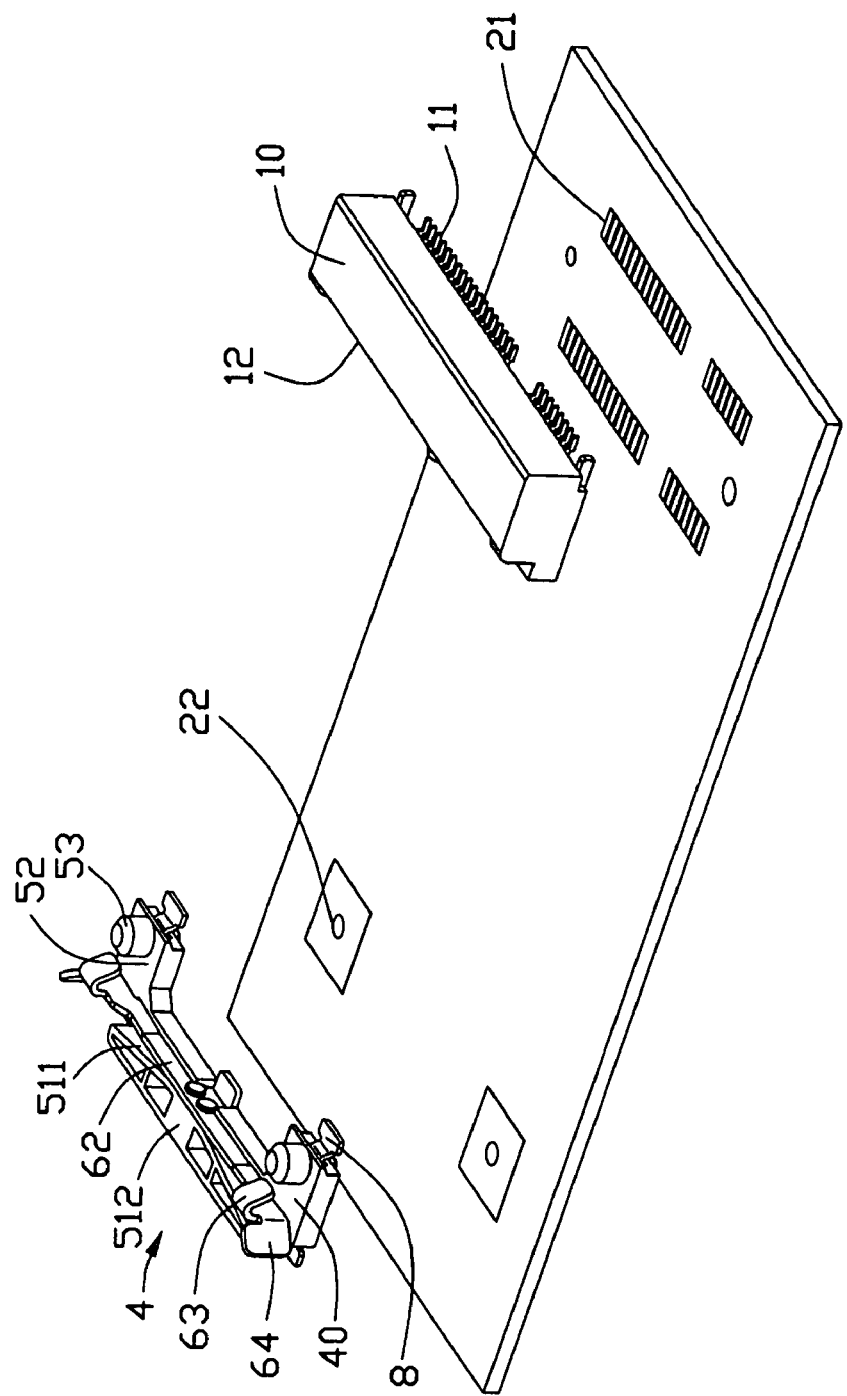
FIG. 3 is an exploded perspective view of the latching mechanism and the corresponding card edge connector above the printed circuit board.

It will be noted here that for a better understanding, most of like components are designated by like reference numerals throughout the various figures in the embodiments. Referring to FIGS. 1–3, a latching mechanism 4 and a card edge connector 1 are commonly mounted to a printed circuit board 2 for holding an electronic card 3 on the printed circuit board 2.

One end of the printed circuit board 2 includes a plurality of conductive pads 21, and the other end thereof defines a pair of through holes 22. The front end 31 of the electronic card 3 includes a plurality of conductors (not shown), and the rear end thereof defines a pair of positioning holes 30. The card edge connector includes an insulative housing 10 and a plurality of conductive contacts 11 therein. The insulative housing 10 defines a card receiving slot 12. One end of the contact 11 is positioned in the slot 12, and the other end thereof is mechanically and electrically connected to the corresponding conductive pad 21. The front end 31 of the electronic card 3 is inserted into the slot 12 to have the conductors mechanically and electrically connected to the end of the corresponding contact 11 so as to form an electrical connection between the electronic card 3 and the printed circuit board 2.

Figure 4:
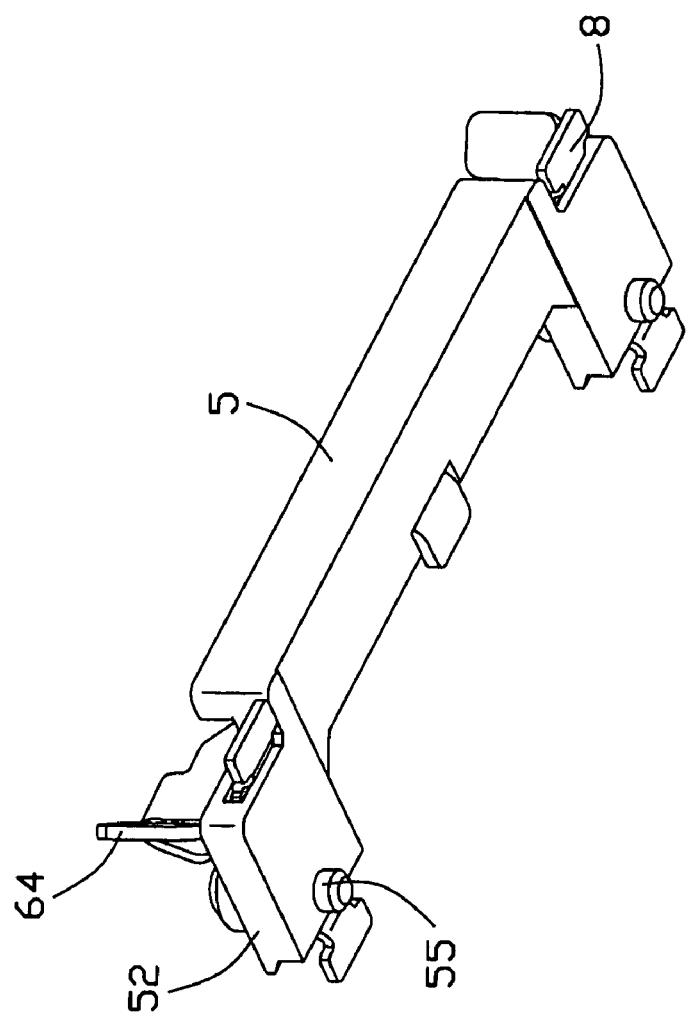
FIG. 4 is an enlarged perspective view of the latching mechanism.
Figure 5:
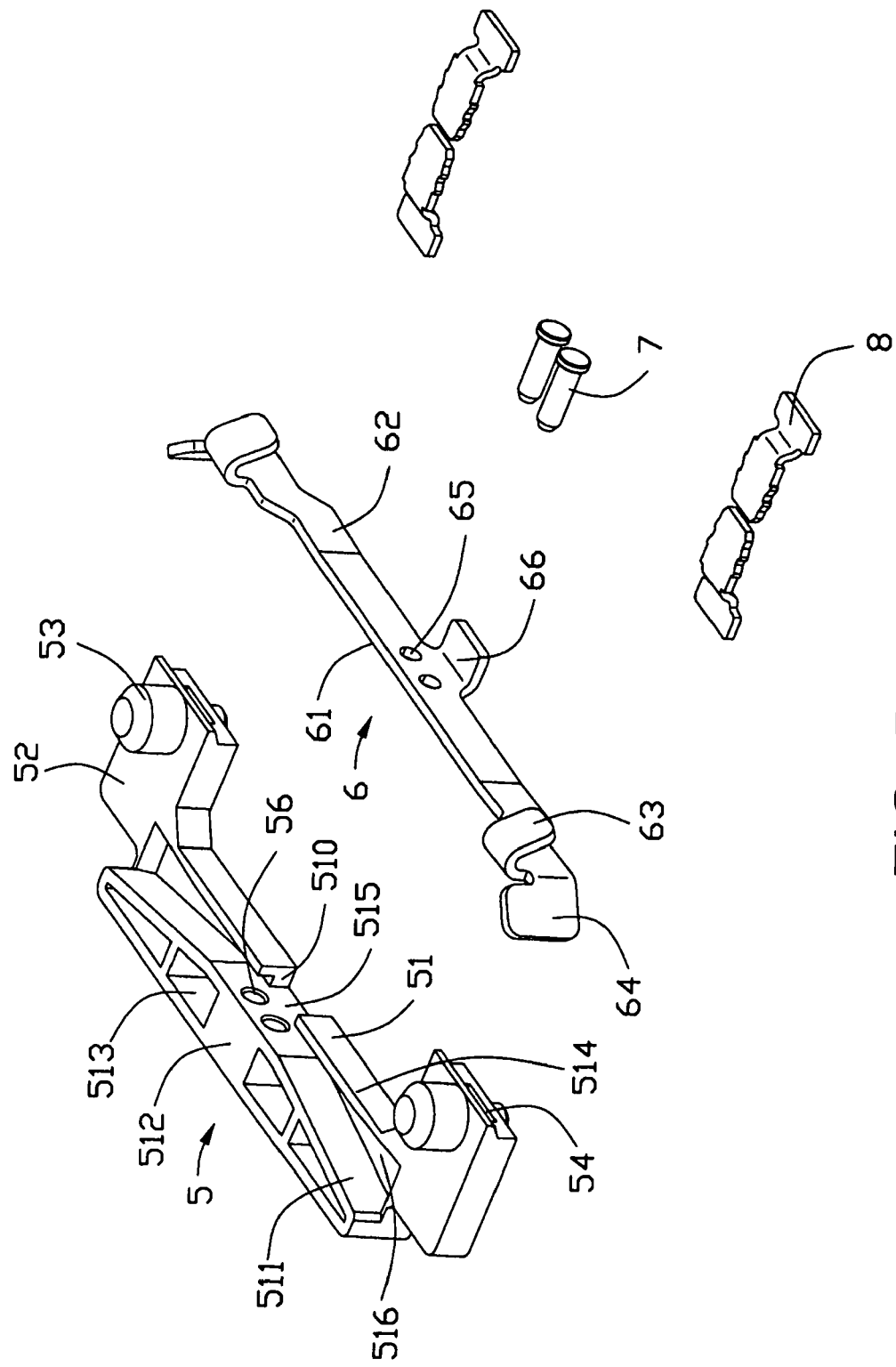
FIG. 5 is an exploded perspective view of the latching mechanism of FIG. 4.

Referring to FIGS. 4 and 5, the latching mechanism 4 includes a fixing device 5 and a latching device 6, wherein the fixing device 5 is made from the insulative material and defines an elongated body 51. A pair of supporting portions 52 extend from two opposite ends of the fixing device toward the card edge connector, and a positioning post 53 extends upwardly from the supporting portions 52 for coupling to the positioning hole 30 of the electronic card 3. The fixing device 5 further includes the channels 54 for use with the solder pad 8. In the embodiment, the channels 54 are provided in the side walls of the supporting portion 52. The fixing device 5 includes the locating posts 55 on the bottom portion, which respectively extend through the through holes 22 of the printed circuit board 2 for mounting the fixing device 5 to the printed circuit board 2. The body 51 includes a bottom wall 510, and an attaching section 515 projects from the bottom wall and is located around a middle portion along the lengthwise direction. A pair of wings 511 extend from the attaching section 515 toward the opposite ends in an oblique manner. An suction plane 512 is formed on the top face of the body 51 essentially vertically aligned with the attaching section 515 for suction assembling the fixing device 5 to the printed circuit board 2. In the body 51, there are a plurality of recesses for keeping uniform of the body 51 during injection molding. A pair of attaching holes 56 are formed in he attaching section 515, and a pair of stoppers 514 extend from the bottom wall 510 beside the attaching section 515 so as to cooperate with the wings 511 to form the space 516 for movement/deflection of the latching device 6. The latching device 6 is made of metal, and includes a connection section 61 on the middle portion along the lengthwise direction thereof. A pair of spring arms 62 extending from the connection section 61 toward the respective ends of the latching device, each including a hook section 63 located at the distal end thereof and extending toward the card edge connector with an oblique upward guiding face thereon, and an operation section 64 the same distal end extending away from the card edge connector and opposite to the hook section 63. The connection section 61 includes other attaching holes 65 corresponding to the attaching holes 64, and a solder leg 66 extending downward therefrom.

The latching device 6 is loaded into the space 516 and fastened to the fixing device 5 via rivets 7 extending through the attaching hole 56 and the corresponding attaching hole 65. After assembled, in the latching mechanism 4, a retaining space 40 is formed between the supporting portion 52 and hook section 63 for holding the rear portion of the electronic card 3. The latching mechanism 4 is fastened to the printed circuit board 2 by means of the locating posts 55 extending through the through holes 22 and the solder pad 8 attached to the printed circuit board 2. During assembling, the front edge of the electronic card 3 is inserted initially into the slot 12 of the card edge connector, and rear edge of the electronic card 3 is successively downwardly moved toward the passing the hook sections 63 wherein the spring arms 62 are rearwardly deflected. At the same time, the electronic card 3 is correctly positioned relative to the printed circuit board 2 via the positioning posts 53 extending through the positioning holes 30 in a stable downward movement. When the rear edge of the electronic card 3 completely passes the hook sections 63, the electronic card 3 is essentially located in the retaining space 40 and the spring arms 62 resume the original position to have the hook sections 63 downwardly press the rear edge of the electronic card 3. Under this condition, the electronic card 3 can not further downwardly moved by means of the supporting portions 52, and further horizontally moved by means of the positioning posts 53 extending through the positioning holes 30. During disassembling, the operation sections 64 are moved rearwardly to have the corresponding spring arms 62 and hook section 63 moved rearwardly associatively, and the rear edge of the card 3 is disengaged from the hook sections 63. It is noted that the wings 511 extend rearwardly and obliquely so as to allow the rearwardly deflected spring arms 62 to be rested thereon for preventing over-deflection rearwardly. On the other hand, the stoppers 514 may isolate the latching device 6 from the electronic card 3 for avoiding directly engagement impact therebetween. As shown, the hook sections 63 are formed on the latching device 6 while the supporting portions 52 and the related positioning posts 53 are formed on the fixing device 5, so that the movement of the hook sections 63 are not restrained by the positioning posts 53, thus allowing a relatively large engagement area between the rear edge of the electronic card 3 and the hook sections 53 for assuring reliable latching function. On the other hand, because the fixing device 5 and the latching device 6 are discrete from each other, it is easy to manufacture/assemble the latching mechanism 4. Moreover, the plastic fixing device reduces risks of shorting during neighboring components.

Understandably, the supporting portion 52 may extend from any proper position of the body 51 toward the card edge connector, as long as to provide a supporting function when the card is in a locked status. The latching device 6 may be coupled to the fixing device 5 via an insert molding process instead of the mechanical rivet fastening. The solder leg 66 may be removed if the solder pads can provide the sufficient attachment effect. Under this situation, when the different height applications are implemented on the printed circuit board 3, it is only required to use the different height fixing device 5 while still keeping the same latching device 6. Also, the solder pads 8 may be integrally formed as one piece or attached to the fixing device 5 via an insert molding process to simplify the manufacturing.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims. Therefore, person of ordinary skill in this field are to understand that all such equivalent structures are to be included within the scope of the following claims.

We claim:

1. A latch mechanism for retaining an electronic card, comprising:

an insulative fixing device and a metallic latching device secured to each other;

said fixing device including:

an elongated body defining at least one supporting portion for supporting the electronic card and at least one positioning post thereabouts for extending through a corresponding positioning hole of the electronic card;

said latching device including:

at least one spring arm with at least one hook section thereon for butting against the electronic card; wherein the fixing device provides at least one wing extending rearwardly and obliquely to prevent rearward over-deflection of the spring arm.

2. A latch mechanism for retaining an electronic card, comprising:

an insulative fixing device and a metallic latching device secured to each other;

said fixing device including:

an elongated body defining at least one supporting portion for supporting the electronic card and at least one positioning post thereabouts for extending through a corresponding positioning hole of the electronic card;

said latching device including:

at least one spring arm with at least one hook section thereon for abutting against the electronic card;

wherein the fixing device includes another supporting portion with another positioning posts thereon, and the latching device includes another spring arm extending in an opposite direction with regard to the spring arm with another hook section thereon; wherein the supporting portion and said another supporting portion are integrally formed at two opposite ends of the elongated body, and the spring arm and said another spring arm are integrally joined together at a middle portion of the latching device.

* * * * *